US008779480B2

(12) United States Patent
Lee et al.

(10) Patent No.: US 8,779,480 B2
(45) Date of Patent: Jul. 15, 2014

(54) PHOTOSENSOR, PHOTOSENSOR APPARATUS INCLUDING THE PHOTOSENSOR, AND DISPLAY APPARATUS INCLUDING THE PHOTOSENSOR APPARATUS

(75) Inventors: Moon-Jae Lee, Yongin (KR); Won-Jun Song, Yongin (KR); Sun-Hee Lee, Yongin (KR); Young-Hee Lee, Yongin (KR); Mu-Hyun Kim, Yongin (KR); Hye-Dong Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 1032 days.

(21) Appl. No.: 12/693,218

(22) Filed: Jan. 25, 2010

(65) Prior Publication Data

US 2010/0201664 A1    Aug. 12, 2010

(30) Foreign Application Priority Data

Feb. 11, 2009    (KR) .................. 10-2009-0011227

(51) Int. Cl.
   *H01L 31/062*    (2012.01)
(52) U.S. Cl.
   USPC .......................................... 257/292
(58) Field of Classification Search
   USPC ............. 257/40, 43, 292, E51.042, E31.003; 438/99, 149, 155; 345/207
   See application file for complete search history.

(56) References Cited

U.S. PATENT DOCUMENTS

| 5,591,963 A | 1/1997 | Takeda et al. |
| 2002/0027229 A1* | 3/2002 | Yamazaki et al. ............... 257/84 |
| 2005/0121068 A1 | 6/2005 | Sager et al. |
| 2005/0284517 A1 | 12/2005 | Shinohara |
| 2007/0072439 A1* | 3/2007 | Akimoto et al. ............... 438/795 |
| 2008/0001144 A1* | 1/2008 | Rand et al. ........................ 257/40 |
| 2008/0277650 A1 | 11/2008 | Chang et al. |
| 2009/0050881 A1* | 2/2009 | Hayashi .......................... 257/40 |
| 2009/0057659 A1* | 3/2009 | Maehara et al. ................ 257/40 |
| 2009/0101953 A1* | 4/2009 | Hayashi et al. ............... 257/292 |

FOREIGN PATENT DOCUMENTS

| CN | 101335274 A | 12/2008 | |
| JP | 05-299682 A | 11/1993 | |
| JP | 8-64793 | 3/1996 | |
| JP | H08-064793 | * 3/1996 | ............ H01L 27/146 |
| JP | 2005-072164 A | 3/2005 | |
| JP | 2005-072164 A | 3/2005 | |
| JP | 2005-183418 A | 7/2005 | |
| JP | 2005183418 | 7/2005 | |
| JP | 2006-13403 A | 1/2006 | |
| JP | 2008-153311 | 7/2008 | |

OTHER PUBLICATIONS

Machine translation, Takeda, Photoelectric Conversion Device, JP H08-064793.*
Japanese Office Action issued Dec. 14, 2010, 2 pages.

(Continued)

*Primary Examiner* — Shaun Campbell
(74) *Attorney, Agent, or Firm* — Knobbe, Martens, Olson & Bear, LLP

(57) ABSTRACT

Provided are a photosensor, a photosensor apparatus including the photosensor, and a display apparatus including the photosensor apparatus. The photosensor includes a substrate; a first light receiving layer which is formed on the substrate and comprises an oxide; a second light receiving layer which is connected to the first light receiving layer and comprises an organic material; and first and second electrodes which are respectively connected to the first and second light receiving layers.

11 Claims, 4 Drawing Sheets

(56) References Cited

OTHER PUBLICATIONS

J.P. Liu, S.S. Wang, Z.Q Bian, M.N. Shan and C.H. Huang, Inverted photovoltaic device based on ZnO and organic small molecule heterojunction, Journal, Jan. 8, 2009, 103-106, vol. 470, Chemical Physics Letters, www.elsevier.com/locate/cplatt.

Partial European Search Report issued by the European Patent Office dated Dec. 17, 2012, 6 pages.

Jiangeng Xue and Stephen R. Forrest, An organic optical bistable switch, Materials, Center for Photonics and Optoelectronic Materials (POEM) and Department of Electrical Engineering, Princeton University, Princeton, NJ, pp. 913-915.

Korean Registration Determination Certificate issued by the Korean Patent Office dated Feb. 24, 2011, 5 pages.

Japanese Official Action issued by the Japanese Patent Office in Japanese Patent Application No. 2011-055690 dated Apr. 17, 2012, 2 pages.

Kenji Nomura, Hiromichi Ohta, Kazushige Ueda, Toshio Kamiya, Masahiro Hirano and Hideo Hosono, Thin-Film Transistor Fabricated in Single-Crystalline Transparent Oxide Semiconductor, Report, May 23, 2003, pp. 1269-1272, vol. 300, www.sciencemag.org.

Extended European Search Report issued in connection with European Patent Application No. 10152625.9.

Chinese Office Action issued on Nov. 12, 2013 in corresponding Chinese Patent Application No. 201010003343.5 in 10 pages.

* cited by examiner

PHOTOSENSOR, PHOTOSENSOR APPARATUS INCLUDING THE PHOTOSENSOR, AND DISPLAY APPARATUS INCLUDING THE PHOTOSENSOR APPARATUS

CROSS-REFERENCE TO RELATED PATENT APPLICATION

This application claims the benefit of Korean Patent Application No. 10-2009-0011227, filed on Feb. 11, 2009, in the Korean Intellectual Property Office, the disclosure of which is incorporated herein in its entirety by reference.

BACKGROUND

1. Field

The present embodiments relate to a photosensor, a photosensor apparatus including the photosensor, and a display apparatus including the photosensor apparatus.

2. Description of the Related Art

Photosensors convert optical signals into electrical signals. Due to current developments in the optical and semiconductor industries, photosensors are being developed to provide various functions. Photosensors included in display apparatuses such as mobile devices including display units, e.g., mobile phones, digital cameras, and personal digital assistants (PDAs), and image display apparatuses, e.g., liquid crystal display (LCD) devices and organic light-emitting devices (OLEDs) are used as the powerful means for providing a touch panel function to the display apparatuses.

Such internal photosensors are more advantageous than external touch panels in terms of thickness, process complexity, aperture rate, etc. of display apparatuses. However, a p-intrinsic-n (PIN) junction diode comprising amorphous or crystalline silicon (Si), which is a general structure of an internal photosensor, cannot increase sensitivity of specific types of light and is limited to only a certain absorption wavelength range of amorphous or crystalline Si. The present embodiments overcome the above problems in the art as well as provide additional advantages.

SUMMARY

The present embodiments provide a photosensor for selectively sensing light in various user-defined wavelength bands and that may be manufactured using a simple manufacturing process, a photosensor apparatus including the photosensor, and a display apparatus including the photosensor apparatus.

According to embodiments of the present invention, there is provided a photosensor including a substrate, a first light receiving layer which is formed on the substrate and includes an oxide, a second light receiving layer which is connected to the first light receiving layer and includes an organic material, and first and second electrodes which are respectively connected to the first and second light receiving layers.

The oxide may include oxygen (O) and at least one element selected from the group consisting of gallium (Ga), indium (In), zinc (Zn), and tin (Sn).

The organic material may include a phthalocyanine compound including at least one metal selected from the group consisting of copper (Cu), iron (Fe), nickel (Ni), cobalt (Co), manganese (Mn), aluminum (Al), palladium (Pd), Sn, In, lead (Pb), titanium (Ti), rubidium (Rb), vanadium (V), Ga, terbium (Tb), cerium (Ce), lanthanum (La), and Zn.

The organic material may have a double-layered structure comprising a first layer including carbon-60 (C60) (fullerene) and a second layer including phthalocyanine compound including at least one metal selected from the group consisting of Cu, Fe, Ni, Co, Mn, Al, Pd, Sn, In, Pb, Ti, Rb, V, Ga, Tb, Ce, La, and Zn.

The organic material may have a single-layered structure in which C60 and a phthalocyanine compound including at least one metal selected from the group consisting of Cu, Fe, Ni, Co, Mn, Al, Pd, Sn, In, Pb, Ti, Rb, V, Ga, Tb, Ce, La, and Zn, are mixed.

The first and second light receiving layers may be vertically stacked on the substrate.

The second light receiving layer may be stacked on the first light receiving layer.

The first light receiving layer may be stacked on the second light receiving layer.

At least one of the first and second electrodes may be a transparent electrode.

According to embodiments of the present invention, there is provided a photosensor apparatus including a photosensor which is formed on a substrate, and at least one sensor signal processing thin film transistor (TFT) which processes a sensor signal received from the photosensor, wherein the photosensor includes a first light receiving layer which is formed on the substrate and includes an oxide, a second light receiving layer which is connected to the first light receiving layer and includes an organic material, and first and second electrodes which are respectively connected to the first and second light receiving layers, and wherein an active layer of the at least one sensor signal processing TFT comprises the same oxide as the first light receiving layer of the photosensor.

The first light receiving layer of the photosensor and the active layer of the at least one sensor signal processing TFT may include oxygen (O) and may include gallium (Ga), indium (In), zinc (Zn), or tin (Sn). These may be used alone or in a combination thereof.

The organic material may include a phthalocyanine compound including copper (Cu), iron (Fe), nickel (Ni), cobalt (Co), manganese (Mn), aluminum (Al), palladium (Pd), Sn, In, lead (Pb), titanium (Ti), rubidium (Rb), vanadium (V), Ga, terbium (Tb), cerium (Ce), lanthanum (La), or Zn. These may be used alone or in a combination thereof.

The organic material may have a double-layered structure consisting of a first layer including carbon-60 (C60) and a second layer including phthalocyanine compound including Cu, Fe, Ni, Co, Mn, Al, Pd, Sn, In, Pb, Ti, Rb, V, Ga, Tb, Ce, La, or Zn. These may be used alone or in a combination thereof.

The organic material may have a single-layered structure in which C60 and a phthalocyanine compound including Cu, Fe, Ni, Co, Mn, Al, Pd, Sn, In, Pb, Ti, Rb, V, Ga, Tb, Ce, La, Zn, or a mixture thereof. These may be used alone or in a combination thereof.

The sensor signal processing TFT may include a gate electrode, a gate insulating film, the active layer, and source and drain electrodes, which are sequentially stacked on the substrate. In the photosensor, the first electrode, the first light receiving layer, the second light receiving layer, and the second electrode may be sequentially stacked on the substrate, the first electrode and the gate electrode may be substantially simultaneously formed by patterning the same material, the first light receiving layer and the active layer may be substantially simultaneously formed, and the second electrode and the source and drain electrodes may be substantially simultaneously formed by patterning the same material.

The sensor signal processing TFT may include a gate electrode, a gate insulating film, the active layer, and source and drain electrodes, which are sequentially stacked on the substrate. In the photosensor, the first electrode, the second light receiving layer, the first light receiving layer, and the second electrode may be sequentially stacked on the substrate, the first electrode and the gate electrode may be substantially simultaneously formed by patterning the same material, the second light receiving layer and the active layer may be substantially simultaneously formed, and the second electrode and the source and drain electrodes may be substantially simultaneously formed by patterning the same material.

The sensor signal processing TFT may include source and drain electrodes, the active layer, a gate insulating film, and a gate electrode, which are sequentially stacked on the substrate. In the photosensor, the first electrode, the first light receiving layer, the second light receiving layer, and the second electrode may be sequentially stacked on the substrate, the first electrode and the source and drain electrodes may be substantially simultaneously formed by patterning the same material, the first light receiving layer and the active layer may be substantially simultaneously formed, and the second electrode and the gate electrode may be substantially simultaneously formed by patterning the same material.

The sensor signal processing TFT may include source and drain electrodes, the active layer, a gate insulating film, and a gate electrode, which are sequentially stacked on the substrate. In the photosensor, the first electrode, the second light receiving layer, the first light receiving layer, and the second electrode may be sequentially stacked on the substrate, the first electrode and the source and drain electrodes may be substantially simultaneously formed by patterning the same material, the second light receiving layer and the active layer may be substantially simultaneously formed, and the second electrode and the gate electrode may be substantially simultaneously formed by patterning the same material.

According to embodiments of the present embodiments, there is provided a display apparatus including a sensor unit which senses and processes an optical signal, and a pixel unit which displays an image according to the optical signal processed by the sensor unit, wherein the sensor unit includes a photosensor including a first light receiving layer which is formed on a substrate and includes an oxide, a second light receiving layer which is connected to the first light receiving layer and includes an organic material, and first and second electrodes which are respectively connected to the first and second light receiving layers, and a sensor signal processing thin film transistor (TFT) which processes a sensor signal received from the photosensor and includes an active layer which comprises the same material as the first light receiving layer of the photosensor, and wherein the pixel unit includes a pixel unit TFT which drives a pixel according to the sensor signal processed by the sensor signal processing TFT and includes an active layer which comprises the same material as the first light receiving layer of the photosensor, and a plurality of pixels which are electrically connected to the pixel unit TFT and display the image.

The pixel unit may include an organic light-emitting diode (OLED) which includes at least an organic light-emitting layer between first and second electrodes.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION

Hereinafter, the present embodiments will be described in detail by explaining exemplary embodiments with reference to the attached drawings.

Figure 1:
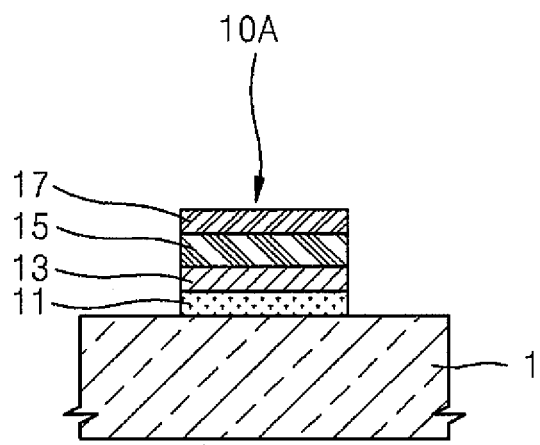
FIG. 1 is a schematic cross-sectional view of a photosensor according to an embodiment.

FIG. 1 is a schematic cross-sectional view of a photosensor 10A according to an embodiment.

Referring to FIG. 1, the photosensor 10A according to the current embodiment includes a first electrode 11, a first light receiving layer 13, a second light receiving layer 15, and a second electrode 17, which are sequentially stacked on a substrate 1.

The substrate 1 may comprise, for example, a transparent glass insulating substrate, a plastic substrate, a quartz substrate, or the like, which may include $SiO_2$. A buffer layer (not shown) comprising $SiO_2$ and/or SiNx may be formed on the substrate 1 in order to smooth out the substrate 1 and to prevent impurities from entering the substrate 1.

The first electrode 11 comprises a conductive material and is formed on the substrate 1. The first electrode 11 that is connected to the first light receiving layer 13 that is an n-type oxide region of a PN junction photodiode constituting the photosensor 10A, may function as a cathode. In this case, the first electrode 11 may comprise, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca), which have low work functions. These may be used alone or in a combination thereof. The first electrode 11 may be formed as a transparent electrode by changing the material or the thickness of the first electrode 11.

The first light receiving layer 13 includes an oxide and is formed on the first electrode 11. The first light receiving layer 13 may include, for example, oxygen (O) and at least one element selected from the group consisting of gallium (Ga), indium (In), zinc (Zn), or tin (Sn). These may be used alone or in a combination thereof. For example, the first light receiving layer 13 may include ZnO, ZnGaO, ZnInO, GaInO, GaSnO, ZnSnO, InSnO, or ZnGaInO. These may be used alone or in a combination thereof. The first light receiving layer 13 functions as an n-type oxide region of a PN junction photodiode constituting the photosensor 10A.

The second light receiving layer 15 includes an organic material and is formed on the first light receiving layer 13. The second light receiving layer 15 may comprise a phthalocyanine compound including copper (Cu), iron (Fe), Ni, cobalt (Co), manganese (Mn), Al, Pd, Sn, In, lead (Pb), titanium (Ti), rubidium (Rb), vanadium (V), Ga, terbium (Tb), cerium (Ce), lanthanum (La), or zinc (Zn). These may be used alone or in a combination thereof. The second light receiving layer 15 functions as a p-type organic material region of a PN junction photodiode constituting the photosensor 10A.

The organic material included in the second light receiving layer 15 may have a double-layered structure comprising a first layer comprising the phthalocyanine compound and a second layer comprising carbon-60 (C60), or a single-layered structure in which the phthalocyanine compound and C60 are mixed. The mixed layer may be formed by using electron-hole pair separation in a bulk-hetero PN-junction. When implemented as a device, the mixed layer is included in a structure of electrode/p-type region (organic material)/PN-mixed region (organic mixed layer)/n-type region (oxide)/electrode, which has superior sensing characteristics to a structure of electrode/p-type region (organic material)/n-type region (oxide)/electrode.

The second electrode 17 comprises a conductive material and is formed on the second light receiving layer 15. The second electrode 17 is connected to the second light receiving layer 15 that functions as a p-type organic material region of a PN junction photodiode constituting the photosensor 10A. The second electrode 17 may function as an anode. In this case, the second electrode 17 may comprise material having relatively high work functions. Examples of the material may include indium tin oxide (ITO), indium zinc oxide (IZO), ZnO, and $In_2O_3$. These may be used alone or in a combination thereof. The second electrode 17 may be a transparent electrode. Alternatively, instead of a transparent electrode, the second electrode 17 may be formed as a metal electrode comprising, for example, Au, Ag, etc., which have high work functions.

As such, a PN junction photodiode constituting the photosensor 10A comprising the first and second electrodes 11 and 17 that are respectively connected to an n-type oxide region and a p-type organic material region, may determine a photosensing band of the photosensor 10A by controlling selection of a metal component to be included in the phthalocyanine compound. For example, a phthalocyanine compound including Cu absorbs visual light in a wavelength band of about 600 to about 800 nm, and a phthalocyanine compound including Sn absorbs near infrared light in a wavelength band of about 800 to about 1,000 nm. Thus, a photosensor capable of sensing light in a user-desired wavelength band may be implemented by controlling selection of a metal component to be included in the phthalocyanine compound.

Figure 2:
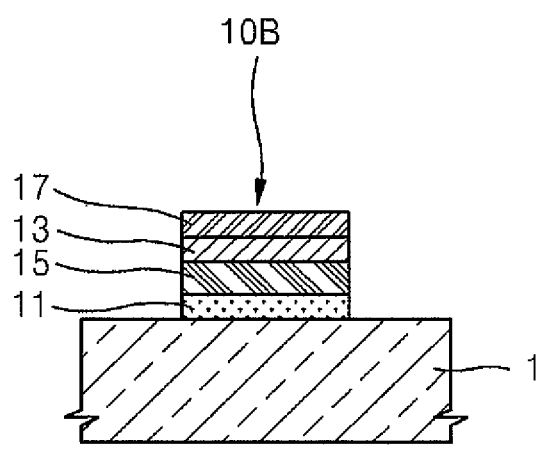
FIG. 2 is a schematic cross-sectional view of a photosensor according to another embodiment.

FIG. 2 is a schematic cross-sectional view of a photosensor 10B according to another embodiment.

Referring to FIG. 2, the photosensor 10B according to the current embodiment includes a first electrode 11, a second light receiving layer 15, a first light receiving layer 13, and a second electrode 17, which are sequentially stacked on a substrate 1. The first electrode 11, the second light receiving layer 15, the first light receiving layer 13, and the second electrode 17 are substantially the same as those of the photosensor 10A illustrated in FIG. 1.

When compared to the photosensor 10A illustrated in FIG. 1, the positions of the first and second light receiving layers 13 and 15 of the photosensor 10A are reversed in the photosensor 10B. Thus, the first electrode 11 is connected to the second light receiving layer 15 including a p-type organic material and the second electrode 17 is connected to the first light receiving layer 13 including an n-type oxide. Accordingly, the first electrode 11 may comprise a conductive material having a high work function, as an anode, and the second electrode 17 may comprise a material having a low work function, as a cathode.

Although each of the photosensors 10A and 10B illustrated in FIGS. 1 and 2 is a PN junction photodiode in which the first and second light receiving layers 13 and 15 are vertically stacked on the substrate 1, the present embodiments are not limited thereto. If necessary, various changes may be made such that, for example, the first and second light receiving layers 13 and 15 are stacked on the substrate 1.

As described above with reference to FIGS. 1 and 2, each of the photosensors 10A and 10B may sense light in a user-desired wavelength band by controlling selection of a metal component to be included in an organic material that forms a PN junction photodiode, constituting the photosensor 10A or 10B, including organic and inorganic materials.

A photosensor apparatus including a photosensor will now be described in detail with reference to FIGS. 3 through 6.

Figure 3:
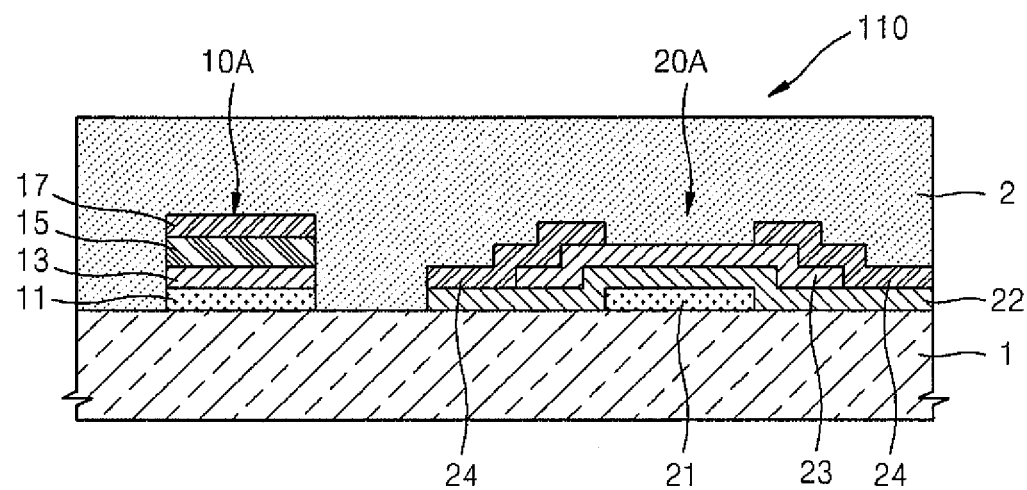
FIG. 3 is a schematic cross-sectional view of a photosensor apparatus according to an embodiment.

FIG. 3 is a schematic cross-sectional view of a photosensor apparatus 110 according to an embodiment.

Referring to FIG. 3, the photosensor apparatus 110 according to the current embodiment includes at least one photosensor 10A that is formed on a substrate 1, and at least one sensor signal processing thin film transistor (TFT) 20A that processes a sensor signal received from the photosensor 10A.

The photosensor 10A of the photosensor apparatus 110 is substantially the same as the photosensor 10A illustrated in FIG. 1. In more detail, the photosensor 10A includes a first electrode 11, a first light receiving layer 13, a second light receiving layer 15, and a second electrode 17, which are sequentially stacked on the substrate 1.

The sensor signal processing TFT 20A includes a gate electrode 21, a gate insulating film 22, an active layer 23, and source and drain electrodes 24, which are sequentially stacked on the substrate 1.

A method of manufacturing the photosensor apparatus 110 will now be briefly described.

Initially, the substrate 1, which comprises a transparent glass material, a plastic material, a quartz material, or the like, and which mainly includes $SiO_2$, is prepared. A buffer layer (not shown) comprising $SiO_2$ and/or SiNx may be formed on the substrate 1 in order to smooth out the substrate 1 and to prevent impurities entering the substrate 1.

A conductive material (not shown) is deposited on the substrate 1. In this case, in the first electrode 11 that is connected to the first light receiving layer 13 that is an n-type oxide region of a PN junction photodiode constituting the photosensor 10A, the conductive material may be have low work functions. Examples of the material may include Ag, Mg, Al, Pt, Pd, Au, Ni, Nd, Ir, Cr, Li, or Ca. These may be used alone or in a combination thereof.

The deposited conductive material is patterned to substantially simultaneously form the first electrode 11 of the photosensor 10A and the gate electrode 21 of the sensor signal processing TFT 20A.

The gate insulating film 22 is formed on the resultant structure. In an inverse staggered type bottom gate TFT such as the sensor signal processing TFT 20A, the gate insulating film 22 is formed between the gate electrode 21 and the active layer 23 which will be described later. A portion of the gate insulating film 22 in an area where the photosensor 10A is disposed is removed.

An oxide is deposited and is patterned to substantially simultaneously form the first light receiving layer 13 of the photosensor 10A and the active layer 23 of the sensor signal processing TFT 20A. The oxide may include oxygen (O) and a material. Examples of the material may include Ga, In, Zn, or Sn. These may be used alone or in a combination thereof.

TFTs are broadly used as signal processing devices in various apparatuses including photosensor apparatuses. Although an active layer of a TFT usually comprises amorphous or crystalline silicon (Si), a high-temperature process is required to be performed on the amorphous or crystalline Si in the manufacture of the TFT. However, in the sensor signal processing TFT 20A using an oxide thin film as a channel layer, a thin film may be directly formed at room temperature by sputtering without performing a high-temperature process. Thus, the process of manufacturing the TFT 20A may be simpler than a conventional process and characteristics such as voltage uniformity and electron mobility of the TFT 20A may be excellent.

Also, the first light receiving layer 13 may function as an n-type oxide region of a PN junction photodiode constituting the photosensor 10A.

Since the first light receiving layer 13 of the photosensor 10A and the active layer 23 of the sensor signal processing TFT 20A are substantially simultaneously formed by using the same material, the manufacturing process may be simplified.

An organic layer comprising a phthalocyanine compound including a predetermined metal is formed on the resultant structure. In addition to the phthalocyanine compound, C60 may be deposited to form an additional layer. Alternatively, a single organic layer in which the phthalocyanine compound and C60 are mixed may be formed on the resultant structure. In this case, examples of the metal may include Cu, Fe, Ni, Co, Mn, Al, Pd, Sn, In, Pb, Ti, Rb, V, Ga, Tb, Ce, La, or Zn. These may be used alone or in a combination thereof. The organic layer may be formed using a method such as chemical vapor deposition (CVD), spin coating, inkjet printing, or screen printing. The formed organic layer is removed except for a portion corresponding to the second light receiving layer 15 of the photosensor 10A.

A conductive material (not shown) is deposited on the resultant structure. In this case, in the second electrode 17 that is connected to the second light receiving layer 15 that is a p-type organic material region of a PN junction photodiode constituting the photosensor 10A, at least one material selected from the group consisting of ITO, IZO, ZnO, and/or $In_2O_3$, which have high work functions, may be deposited as the conductive material. The deposited conductive material is patterned to substantially simultaneously form the second electrode 17 of the photosensor 10A and the source and drain electrodes 24 of the sensor signal processing TFT 20A.

An insulating protective layer 2 is formed on the resultant structure to sufficiently cover the photosensor 10A and the sensor signal processing TFT 20A, thereby completing the manufacture of the photosensor apparatus 110 according to the current embodiment.

A photosensing band of the photosensor 10A of the photosensor apparatus 110 according to the current embodiment may be determined by controlling selection of the metal included in the phthalocyanine compound. Furthermore, since a plurality of layers of the photosensor 10A and the sensor signal processing TFT 20A are substantially simultaneously formed by patterning the same materials, the manufacturing process may be simplified and thus manufacturing costs may be reduced.

Figure 4:
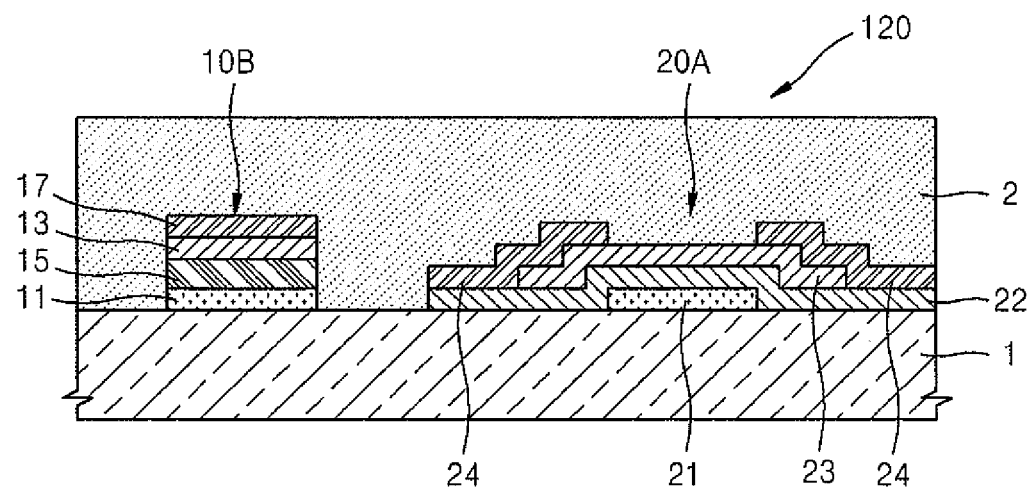
FIG. 4 is a schematic cross-sectional view of a photosensor apparatus according to another embodiment.

FIG. 4 is a schematic cross-sectional view of a photosensor apparatus 120 according to another embodiment.

Referring to FIG. 4, the photosensor apparatus 120 according to the current embodiment includes at least one photosensor 10B that is formed on a substrate 1, and at least one sensor signal processing TFT 20A that processes a sensor signal received from the photosensor 10B. The photosensor 10B is substantially the same as the photosensor 10B of FIG. 2.

When compared to the photosensor apparatus 110 illustrated in FIG. 3, the positions of the first and second light receiving layers 13 and 15 of the photosensor 10A are reversed in the photosensor 10B of the photosensor apparatus 120. Thus, the first electrode 11 is connected to the second light receiving layer 15 including a p-type organic material and the second electrode 17 is connected to the first light receiving layer 13 including an n-type oxide. Accordingly, the first electrode 11 may comprise a conductive material having a high work function, as an anode, and the second electrode 17 may comprise a material having a low work function, as a cathode.

In terms of differences between the processes of manufacturing the photosensor apparatuses 110 and 120, initially, the first electrode 11 of the photosensor 10B and the gate electrode 21 of the sensor signal processing TFT 20A are substantially simultaneously formed by patterning the same material. An insulating material is deposited and then patterned to form the gate insulating film 22, and the insulating material in an area where the photosensor 10B is disposed is removed. An organic layer is formed on the resultant structure and is patterned to form the second light receiving layer 15 of the photosensor 10B. An oxide is deposited on the resultant structure and is patterned to substantially simultaneously form the first light receiving layer 13 of the photosensor 10B and the active layer 23 of the sensor signal processing TFT 20A. A conductive material is deposited on the resultant structure and then is patterned to substantially simultaneously form the second electrode 17 of the photosensor 10B and the source and drain electrodes 24 of the sensor signal processing TFT 20A. The insulating protective layer 2 is formed on the resultant structure to sufficiently cover the photosensor 10B and the sensor signal processing TFT 20B, thereby completing the manufacture of the photosensor apparatus 120 according to the current embodiment.

Figure 5:
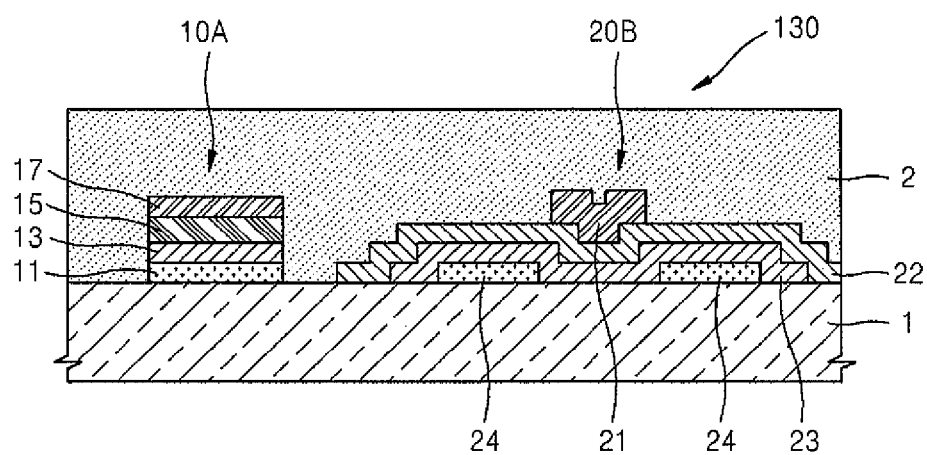
FIG. 5 is a schematic cross-sectional view of a photosensor apparatus according to another embodiment.

FIG. 5 is a schematic cross-sectional view of a photosensor apparatus 130 according to another embodiment.

Referring to FIG. 5, the photosensor apparatus 130 according to the current embodiment includes at least one photosensor 10A that is formed on a substrate 1, and at least one sensor signal processing TFT 20B that processes a sensor signal received from the photosensor 10A. The photosensor 10A is substantially the same as the photosensor 10A of FIG. 1.

When compared to the photosensor apparatus 110 illustrated in FIG. 3, the sensor signal processing TFT 20B of the photosensor apparatus 130 is a staggered type top gate TFT. Thus, the first electrode 11 of the photosensor 10A and the source and drain electrodes 24 of the sensor signal processing TFT 20B are substantially simultaneously formed by patterning the same material. The first light receiving layer 13 of the photosensor 10A and the active layer 23 of the sensor signal processing TFT 20B are substantially simultaneously formed by patterning the same material. The gate insulating film 22 is formed on the resultant structure except for an area where the photosensor 10A is disposed. The second electrode 17 of the photosensor 10A and the gate electrode 21 of the sensor signal processing TFT 20B are substantially simultaneously formed by patterning the same material. The insulating protective layer 2 is formed on the resultant structure to sufficiently cover the photosensor 10A and the sensor signal processing TFT 20B, thereby completing the manufacture of the photosensor apparatus 130 according to the current embodiment.

Figure 6:
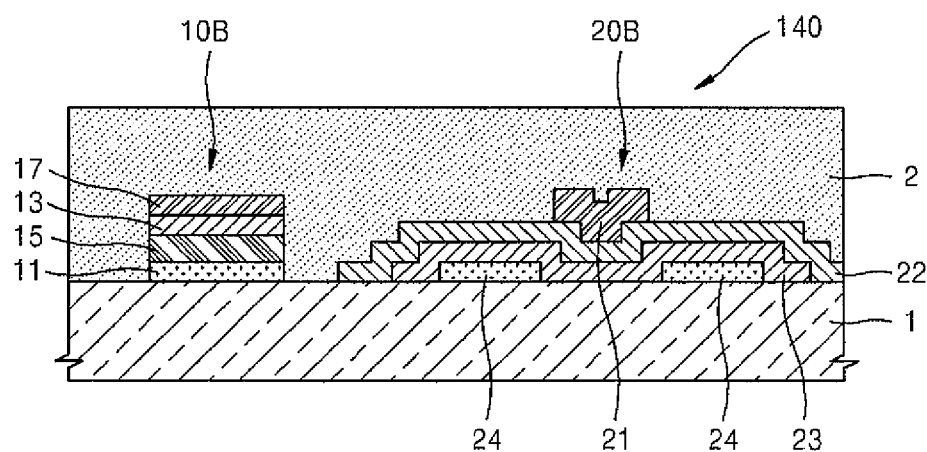
FIG. 6 is a schematic cross-sectional view of a photosensor apparatus according to another embodiment.

FIG. 6 is a schematic cross-sectional view of a photosensor apparatus 140 according to another embodiment.

Referring to FIG. 6, the photosensor apparatus 140 according to the current embodiment includes at least one photosensor 10B that is formed on a substrate 1, and at least one sensor signal processing TFT 20B that processes a sensor signal received from the photosensor 10B. The photosensor 10B is substantially the same as the photosensor 10B of FIG. 2.

When compared to the photosensor apparatus 110 illustrated in FIG. 3, the positions of the first and second light receiving layers 13 and 15 of the photosensor 10A are reversed in the photosensor 10B of the photosensor apparatus 140, and the sensor signal processing TFT 20B of the photosensor apparatus 140 is a staggered type top gate TFT. Thus, the first electrode 11 is connected to the second light receiving layer 15 including a p-type organic material and the second electrode 17 is connected to the first light receiving layer 13 including an n-type oxide. Accordingly, the first electrode 11 may comprise a conductive material having a high work function, as an anode, and the second electrode 17 may comprise a material having a low work function, as a cathode.

In terms of differences in processes of manufacturing the photosensor apparatuses 110 and 140, initially, the first electrode 11 of the photosensor 10B and the source and drain electrodes 24 of the sensor signal processing TFT 20B are substantially simultaneously formed by patterning the same material. An organic material is deposited on the resultant structure and is patterned to form the second light receiving layer 15 of the photosensor 10B. An oxide is deposited and is patterned to substantially simultaneously form the first light receiving layer 13 of the photosensor 10B and the active layer 23 of the sensor signal processing TFT 20B. An insulating material is deposited on the resultant structure and is then patterned to form the gate insulating film 22. The insulating material in an area where the photosensor 10B is disposed is then removed. The second electrode 17 of the photosensor 10B and the gate electrode 21 of the sensor signal processing TFT 20B are substantially simultaneously formed by patterning the same material. The insulating protective layer 2 is formed on the resultant structure to sufficiently cover the photosensor 10B and the sensor signal processing TFT 20B, thereby completing the manufacture of the photosensor apparatus 140 according to the current embodiment.

As described above with reference to FIGS. 3 through 6, each of the photosensor apparatus 110, 120, 130, and 140 may sense light in various user-desired wavelength bands by controlling selection of a metal component to be included in a phthalocyanine compound that forms a PN junction photodiode. Also, a low-temperature process may be applied and device characteristics may be improved, by forming a channel layer of a TFT by using an oxide. Furthermore, the manufacturing process may be simplified and thus manufacturing costs may be reduced when a channel layer of a TFT and a light receiving layer of a photosensor comprise the same oxide.

A display apparatus will now be described in detail with reference to FIG. 7.

Figure 7:
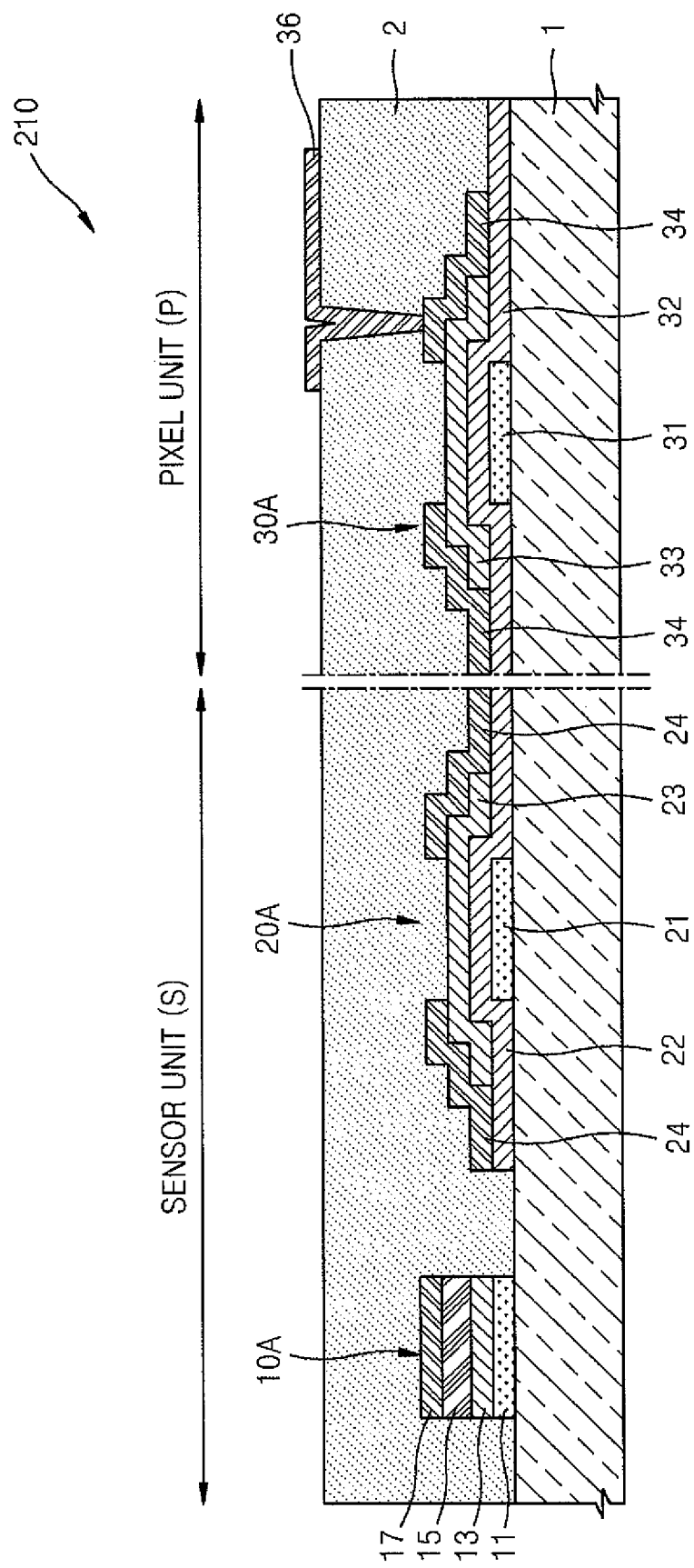
FIG. 7 is a schematic cross-sectional view of a display apparatus according to an embodiment.

FIG. 7 is a schematic cross-sectional view of a display apparatus 210 according to an embodiment.

Referring to FIG. 7, the display apparatus 210 according to the current embodiment includes a sensor unit S that senses and processes an optical signal, and a pixel unit P that displays an image according to the optical signal processed by the sensor unit S.

The sensor unit S includes the photosensor 10A and the sensor signal processing TFT 20A that are included in the photosensor apparatus 110 illustrated in FIG. 3.

The pixel unit P includes at least one pixel unit TFT 30A. For convenience of explanation, the pixel unit TFT 30A illustrated in FIG. 7 is directly connected to a pixel electrode 36. However, the present embodiments are not limited thereto and various devices such as a switching device and a capacitor may further be included in the pixel unit P if necessary.

In the display apparatus 210, the first light receiving layer 13 of the photosensor 10A, the active layer 23 of the sensor signal processing TFT 20A, and an active layer 33 of the pixel unit TFT 30A may comprise the same oxide. The oxide may be, for example, ZnO, ZnGaO, ZnInO, GaInO, GaSnO, ZnSnO, InSnO, or ZnGaInO.

The oxide forms the first light receiving layer 13 of the photosensor 10A, which functions as an n-type oxide region of a PN junction photodiode. Also, each of the sensor signal processing TFT 20A of the sensor unit S and the pixel unit TFT 30A of the pixel unit P, which comprise the oxide, may be manufactured as a device having excellent characteristics, by performing a low-temperature process. A TFT comprising an oxide may be directly formed on a plastic substrate or film at room temperature by sputtering and thus may satisfy currently increasing demands for flexible and light display apparatuses.

A desired sensing band may be selected by forming an organic layer comprising a phthalocyanine compound including a predetermined metal, constituting the second light receiving layer 15 of the photosensor 10A. Since a plurality of layers of the photosensor 10A, the sensor signal processing TFT 20A, and the pixel unit TFT 30A are substantially simultaneously formed by patterning the same materials, the manufacturing process may be simplified and thus manufacturing costs may be reduced.

Although not shown, the pixel unit P may include various display devices. For example, the pixel unit P may include an organic light-emitting diode (OLED) that uses the pixel electrode 36 as a first electrode, includes a second electrode (not shown) opposite to the pixel electrode 36, and includes an organic light-emitting layer (not shown) between the first and second electrodes.

Such an OLED is a suitable device for implementing transparent and flexible display apparatuses, which are currently in demand. If the OLED is an active OLED, the active OLED may be formed on, for example, a plastic substrate using a low-temperature process by forming a circuit by using the above-described oxide TFTs such as the sensor signal processing TFT 20A and the pixel unit TFT 30A.

Also, the photosensor 10A included in the display apparatus 210 may provide a touch panel function and may reduce the thickness, process complexity, aperture rate, etc. of the display apparatus 210 in comparison to an external touch panel. Furthermore, in comparison to a p-intrinsic-n (PIN) junction diode based on Si, which is a general structure of an internal photosensor, the photosensor 10A of the present embodiments may sense light in various wavelength bands by controlling selection of a metal component to be included in an organic material that forms a PN junction photodiode constituting the photosensor 10A.

The present embodiments are not limited to the display apparatus 210 according to the current embodiment, including the photosensor 10A and the sensor signal processing TFT 20A, and may be applied to any combination of the photosensors 10A and 10B and the sensor signal processing TFTs 20A and 20B illustrated in FIGS. 3 through 6.

As described above, a photosensor according to the present embodiments may sense light in various user-desired wavelength bands.

A photosensor apparatus according to the present embodiments may sense light in various user-desired wavelength bands, and may be manufactured using a simple manufacturing process, thereby reducing manufacturing costs.

A display apparatus according to the present embodiments may provide a touch panel function by using a photosensor capable of sensing light in various user-desired wavelength bands, and may be manufactured using a simple manufacturing process, thereby reducing manufacturing costs.

Since components illustrated in the drawings may be enlarged or reduced for convenience of explanation, the present embodiments are not limited to the sizes and shapes of the components illustrated in the drawings. It will be understood by one of ordinary skill in the art that various changes in form and details may be made therein without departing from the spirit and scope of the present embodiments as defined by the following claims.

What is claimed is:

1. A photosensor apparatus comprising a photosensor which is formed on a substrate, and at least one sensor signal processing thin film transistor (TFT) which processes a sensor signal received from the photosensor,
wherein the photosensor comprises a first light receiving layer which is formed on the substrate and comprises an oxide comprising oxygen (O) and gallium (Ga); a second light receiving layer which is connected to the first light receiving layer and comprises an organic material; and first and second electrodes which are respectively connected to the first and second light receiving layers, and
wherein an active layer of the at least one sensor signal processing TFT comprises the same oxide as the first light receiving layer of the photosensor.

2. The photosensor apparatus of claim 1, wherein the first light receiving layer of the photosensor and the active layer of the at least one sensor signal processing TFT comprise oxygen (O) and at least one element selected from the group consisting of gallium (Ga), indium (In), zinc (Zn), and tin (Sn).

3. The photosensor apparatus of claim 1, wherein the organic material comprises a phthalocyanine compound comprising at least one metal selected from the group consisting of copper (Cu), iron (Fe), nickel (Ni), cobalt (Co), manganese (Mn), aluminum (Al), palladium (Pd), tin (Sn), indium (In), lead (Pb), titanium (Ti), rubidium (Rb), vanadium (V), gallium (Ga), terbium (Tb), cerium (Ce), lanthanum (La), and (zinc) Zn.

4. The photosensor apparatus of claim 1, wherein the organic material has a double-layered structure comprising a first layer comprising carbon-60 (C60) and a second layer comprising phthalocyanine compound comprising at least one metal selected from the group consisting of copper (Cu), iron (Fe), nickel (Ni), cobalt (Co), manganese (Mn), aluminum (Al), palladium (Pd), tin (Sn), indium (In), lead (Pb), titanium (Ti), rubidium (Rb), vanadium (V), gallium (Ga), terbium (Tb), cerium (Ce), lanthanum (La), and zinc (Zn).

5. The photosensor apparatus of claim 1, wherein the organic material has a single-layered structure in which C60 and a phthalocyanine compound comprising at least one metal selected from the group consisting of copper (Cu), iron (Fe), nickel (Ni), cobalt (Co), manganese (Mn), aluminum (Al), palladium (Pd), tin (Sn), indium (In), lead (Pb), titanium (Ti), rubidium (Rb), vanadium (V), gallium (Ga), terbium (Tb), cerium (Ce), lanthanum (La), and zinc (Zn), are mixed.

6. The photosensor apparatus of claim 1, wherein the sensor signal processing TFT comprises a gate electrode, a gate insulating film, the active layer, and source and drain electrodes, which are sequentially stacked on the substrate,
wherein, in the photosensor, the first electrode, the first light receiving layer, the second light receiving layer, and the second electrode are sequentially stacked on the substrate,
wherein the first electrode and the gate electrode are substantially simultaneously formed by patterning the same material,
wherein the first light receiving layer and the active layer are substantially simultaneously formed, and
wherein the second electrode and the source and drain electrodes are substantially simultaneously formed by patterning the same material.

7. The photosensor apparatus of claim 1, wherein the sensor signal processing TFT comprises a gate electrode, a gate insulating film, the active layer, and source and drain electrodes, which are sequentially stacked on the substrate,
wherein, in the photosensor, the first electrode, the second light receiving layer, the first light receiving layer, and the second electrode are sequentially stacked on the substrate,
wherein the first electrode and the gate electrode are substantially simultaneously formed by patterning the same material,
wherein the second light receiving layer and the active layer are substantially simultaneously formed, and
wherein the second electrode and the source and drain electrodes are substantially simultaneously formed by patterning the same material.

8. The photosensor apparatus of claim 1, wherein the sensor signal processing TFT comprises source and drain electrodes, the active layer, a gate insulating film, and a gate electrode, which are sequentially stacked on the substrate,
wherein, in the photosensor, the first electrode, the first light receiving layer, the second light receiving layer, and the second electrode are sequentially stacked on the substrate,
wherein the first electrode and the source and drain electrodes are substantially simultaneously formed by patterning the same material,
wherein the first light receiving layer and the active layer are substantially simultaneously formed, and
wherein the second electrode and the gate electrode are substantially simultaneously formed by patterning the same material.

9. The photosensor apparatus of claim 1, wherein the sensor signal processing TFT comprises source and drain electrodes, the active layer, a gate insulating film, and a gate electrode, which are sequentially stacked on the substrate,
wherein, in the photosensor, the first electrode, the second light receiving layer, the first light receiving layer, and the second electrode are sequentially stacked on the substrate,
wherein the first electrode and the source and drain electrodes are substantially simultaneously formed by patterning the same material,
wherein the second light receiving layer and the active layer are substantially simultaneously formed, and
wherein the second electrode and the gate electrode are substantially simultaneously formed by patterning the same material.

10. A display apparatus comprising a sensor unit configured to sense and process an optical signal, and a pixel unit which displays an image according to the optical signal processed by the sensor unit,
wherein the sensor unit comprises:
a photosensor comprising a first light receiving layer which is formed on a substrate and comprises an oxide comprising oxygen (O) and gallium (Ga); a second light receiving layer which is connected to the first light receiving layer and comprises an organic material; and first and second electrodes which are respectively connected to the first and second light receiving layers; and a sensor signal processing thin film transistor (TFT) which processes a sensor signal received from the photosensor and comprises an active layer which comprises the same material as the first light receiving layer of the photosensor, and wherein the pixel unit comprises:

a pixel unit TFT which drives a pixel according to the sensor signal processed by the sensor signal processing TFT and comprises an active layer which comprises the same material as the first light receiving layer of the photosensor; and a plurality of pixels which are electrically connected to the pixel unit TFT and display the image.

11. The display apparatus of claim 10, wherein the pixel unit comprises an organic light-emitting diode (OLED) which comprises at least an organic light-emitting layer between first and second electrodes.

* * * * *